United States Patent [19]

Keren et al.

[11] Patent Number: 4,901,022

[45] Date of Patent: Feb. 13, 1990

[54] BROADBAND MATCHING AND DECOUPLING NETWORK

[75] Inventors: Hanan Keren, Kfar Saba; Itzchak Linenberg, Netanya, both of Israel

[73] Assignee: Elscint, Ltd., Haifa, Israel

[21] Appl. No.: 374,552

[22] Filed: Jul. 5, 1989

Related U.S. Application Data

[63] Continuation of Ser. No. 140,787, Jan. 5, 1988, abandoned.

[51] Int. Cl.[4] .............................................. G01R 33/20
[52] U.S. Cl. ..................................................... 324/322
[58] Field of Search ................. 324/309, 311, 318, 322

[56] References Cited

U.S. PATENT DOCUMENTS 4,689,563 8/1987 Bottomley et al. ............. 324/309

OTHER PUBLICATIONS

Kisman et al., "Coupling Scheme . . . Single Coil Probe", Rev. Sci. Instrum., vol. 45, No. 9, Sep. 1974.

Primary Examiner—Michael J. Tokar
Assistant Examiner—Kevin D. O'Shea
Attorney, Agent, or Firm—Sandler & Greenblum

[57] ABSTRACT

A broadband matching and decoupling network for matching RF coils to an MR system at more than one Larmor frequency using coaxial cable that is equal to $\frac{1}{4}\lambda$ at the lower Larmor frequency and an odd multiple of $\frac{1}{4}\lambda$ at the higher Larmor frequency.

4 Claims, 2 Drawing Sheets

BROADBAND MATCHING AND DECOUPLING NETWORK

This application is a continuation of application Ser. No. 07/140,787, filed Jan. 5, 1988 now abandoned.

FIELD OF THE INVENTION

This invention is concerned with magnetic resonance systems and more particularly with systems having broadband matching and decoupling networks which enable obtaining magnetic resonance data on the nuclei of at least two different elements without the necessity of changing matching and decoupling networks used in the magnetic resonance systems.

BACKGROUND OF THE INVENTION

Nuclear magnetic resonance (NMR) spectrometers were used to acquire data on many different elements long before the use of the magnetic resonance systems for imaging purposes. The "spins" of different elements precess at different frequencies which are known as the Larmor frequencies. Accordingly, even before magnetic resonance imaging (MRI) either extremely broad band matching and decoupling networks that function over the wide frequency bands necessary for getting data from the moments of different elements or different matching and decoupling networks for each of the individual moments of the different elements on which data is to be taken were used. Having to change the matching and decoupling networks during examinations, of course, involves extra equipment with the added expenses as well as the added time for either actually physically changing or switching between equipment. In either case, the extra equipment adds to cost of the system.

Presently MRI and magnetic resonance spectroscopy systems are used to acquire morphylogical and physiological data from such elements as phosphorous, sodium and hydrogen, among others. In magnetic fields of 1.9 Tesla the Larmor frequency for phosphorous (P) is 32 MHz. The Larmor frequency for sodium (NA) is 21 MHz and the Larmor frequency for hydrogen (H) is 81 MHz. Therefore, MR systems require tailored matching and decoupling networks for those elements or broad band matching and decoupling networks capable of being used when acquiring data on diverse elements. The broad band matching and decoupling network is a preferable solution but providing such networks has proven extremely difficult and/or expensive.

Among the difficulties encountered when attempting to use broad band matching and decoupling networks is due to the fact that in many MR systems both the receiving and transmitting operations use the same radio frequency RF coil. Therefore, the switching between the receiving mode and the transmitting mode must be accomplished in short time spans. Any frequency dependent components (capacitors, inductors) could be adversely effected by short switching times—i.e. transients are formed. Accordingly the matching and decoupling network ideally should have frequency independent components.

BRIEF DESCRIPTION OF THE INVENTION

In accordance with a broad aspect of the present invention a broadband matching and decoupling network is provided to match the RF coils to a transmitter and a receiver in an MRI system at more than one frequency and to decouple the transmitter from the receiver at more than one frequency to thereby enable the use of the same matching and decoupling network at more than one frequency, the matching and decoupling network comprising:

coupling means for coupling a transmitter and a receiver of said MR system to said RF coil, said coupling means comprising a first coaxial cable coupling said RF coil to a point on a second coaxial cable extending between said transmitter and said receiver, RF amplifier means on the transmitter side of said point in said second coaxial cable for amplifying RF pulses to be transmitted by said RF coil, an RF pre-amplifier means on the receiver side of said point in said second coaxial cable for preamplifying RF signals detected by said coil, first decoupling means for decoupling said receiver during transmission of said RF pulses, second decoupling means for decoupling said transmitter during receipt by said receiver of said RF signals, said first decoupling means including first and second switch means, said first switch means for shorting the second coaxial cable to ground and second switch means for opening the circuit from the second coaxial cable to the preamplifier means, a $\lambda/4$ plus $(\lambda/2)N$ coaxial line between said first switch means for shorting and said point where $\lambda$ is the wave length at the lower Larmor frequency and the ratio of the higher frequency to the lower frequency is an odd integer, whereby said point is in an open circuit condition at $\lambda/4$ and at $\frac{3}{4}\lambda H$ when said amplifier input is shorted.

In a broader aspect of the present invention a broadband matching and decoupling network to match the RF coils to an MR system and to decouple transmitter means and receiver means of the MR system at more than one frequency is provided which enables the use of the same matching and decoupling network at more than one frequency, said system comprises:

matching means for coupling a transmitter and a receiver of said MRI system to said RF coils, said matching means comprising a first coaxial cable coupling said coil to a point on a second coaxial cable extending between said transmitter and said receiver, RF amplifier means between said transmitter and said point in said second coaxial cable for amplifying RF pulses to be transmitted by said RF coil, RF pre-amplifier means between said receiver side and said point in said second coaxial cable for pre-amplifying RF signals detected by said coil, first decoupling means for decoupling said receiver during transmitting, second decoupling means for decoupling said transmitter during receiving, said first decoupling means including first and second switch means, said first switch means for shorting the input to said pre-amplifier means to ground during transmitting, said second switch means for opening the circuit to the preamplifier means during transmitting, and coaxial cable means extending between said point and said first decoupling means for causing such shorted input to appear as an open circuit condition at said point at two separated frequencies.

In accordance with a feature of the invention the means for causing the short circuit condition to appear as an open circuit condition comprises a coaxial cable between said point and the input to said preamplifier means, said coaxial cable having a length at least equal to: $f_H \lambda H/4 f_L$ where:

$\lambda_H$ is the wavelength at the higher Larmor frequency of the two separated frequencies, $f_H$ is the higher frequency, and $f_L$ is the lower frequency; and $f_H/f_L$ is an odd integer.

Thus, where $f_H=81$ mHz and $f_L=27$ mHz then the length of coaxial cable should be $3\lambda H/4$. Note that $3\lambda H/4$ is equal to $\frac{1}{4}\lambda L$.

With an 1.9 Tesla strength magnet the resonant frequency of a hydrogen nucleous is 81 MHz and the resonant frequency of phosphate-31 is 33 MHz while the resonant frequencies of sodium-23 and carbon-13 are 21.4 MHz and 21 MHz respectively. It is fair to consider the Larmor frequency of the phosphate, sodium and carbon to be 27 MHz plus or minus 6 MHz which is one third of 81. If the length l of the co-axial cable that extends between the point P where the coil is connected to the line and the shorting means is $(\frac{1}{4})\lambda H+(\frac{1}{2})N\lambda H$ with N any positive integer including zero, the short will be reflected as a high impedance where the difference between the actual frequency used and the frequency where l is equal to $n\lambda H/4$ (n is any odd integer starting with (1) is an amount which causes the reflectance to be at least 20 Db down. Therefore, using cable having a length equal to $(\frac{3}{4})\lambda H$ will enable operating at either $27\pm6$ MHz or 81 MHz. The operation at $27\pm6$ MHz enables acquiring the data on phosphate 31, sodium and carbon; while the operation at 81 MHz enables obtaining data on Hydrogen protons or fluor-19.

Mathematically the general solution for the cable length can be derived as follows:

$$l = \lambda H/4 + n\lambda H/2 \quad (1)$$

$$l = \lambda L/4 + m\lambda L/2 \quad (2)$$

equating equations (1) and (2) gives:

$$\lambda H/4 + n\lambda H/2 = \lambda L/4 + m\lambda L/2$$

or:

$$\frac{\lambda L}{\lambda H} = \frac{1 + 2n}{1 + 2m} \text{ where } m,n = 0, 1, 2 \quad (3)$$

that is m and n are positive integers including 0.

For the case of $f_H/f_L=3$ i.e. $\lambda L/\lambda H = 3$ then n=1 and m=0;

therefore, $l=\frac{3}{4}\lambda H$ and for 81 mHz, l=186 cms.

BRIEF DESCRIPTION OF THE DRAWINGS

The above mentioned and other objects and features of the present invention will be better understood when considered with the following description of a broad aspect of the invention made with reference to the accompanying drawings; wherein.

GENERAL DESCRIPTION

Figure 1:
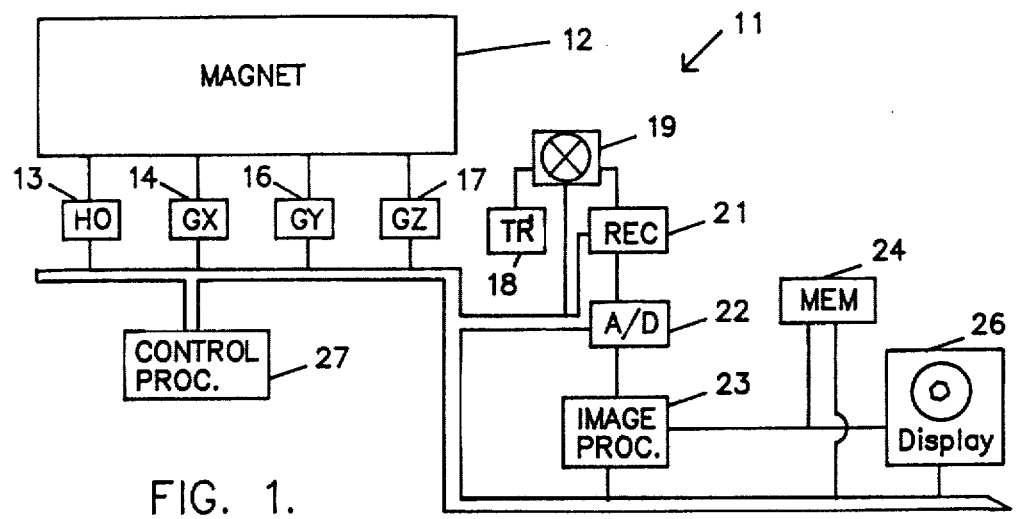
FIG. 1 is a magnetic resonance data acquisition system including an inventive matching and decoupling network for use in acquiring magnetic resonance data either for imaging or for spectographic purposes.

FIG. 1 at 11 shows a typical magnetic resonance data acquisition system (except for the inventive decoupling circuitry as explained with reference to FIGS. 2-5) comprising a magnet 12 used for producing a large static homogeneous magnetic field and for receiving a patient within the magnet. The large static magnetic field is generated by field generator Ho shown at 13. The large static field causes the magnetic moment of "spins" of different elements having an odd number of protons and or neutrons to align with the static field.

Gradient fields are generated by the gradient field generators GX indicated at 14, GY indicated at 16 and GZ indicated at 17. In the usual MR procedure for imaging for example, the moments are tipped into the XY plane (when the large magnetic field is along the Z axis) responsive to the transmission of a radio frequency pulse. The radio frequency pulse is transmitted by circuitry shown in block 18 through a decoupling and matching circuit 19 to an RF coil (not shown) in the magnet. The same or a different RF coil can be used to detect RF signals either FID signals or echo signals depending on the scan sequence used. The detected signals are transferred through the decoupling and matching network 19 to receiver means 21. The received analog signals are converted to digital signals with an analog-to-digital convertor 22. The digital signals are processed in an imaging processor 23 which may have memory means 24 cooperating with the processor. In any case, the processed digital data is used to provide the image in the display means 26. The entire procedure is under the control of control processor 27.

Figure 2:
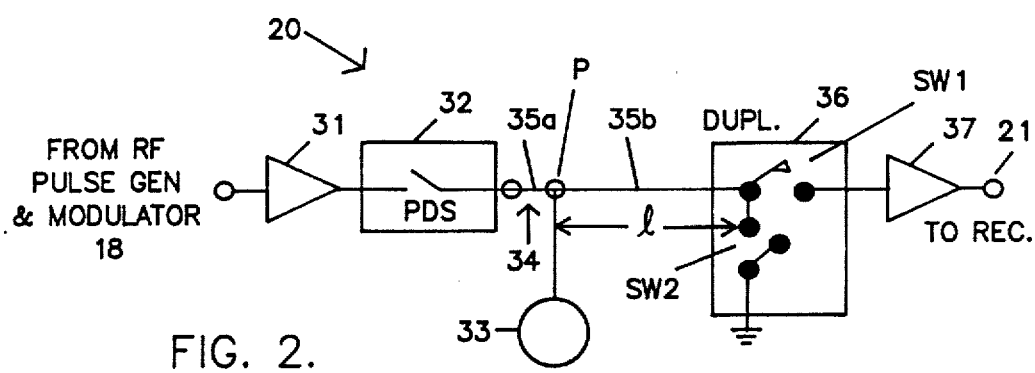
FIG. 2 is a block diagram showing of the inventive matching and decoupling network used in the system of FIG. 1.

The decoupling portion of the decoupling and matching network 19 is shown at 20 in FIG. 2. Standard matching procedures; that is, circuit components are used to impedance match the system to the normal 50 Ohm lines. The decoupling should not effect the matching. It is in the decoupling portion of the decoupling and matching network that the invention lies.

Decoupling circuit 20 is shown as including an amplifier 31 which receives its input from an RF pulse generator and modulator included in the transmitter 18 of FIG. 1. It should be understood that the amplifier means can be included in the circuitry of the transmitter.

The amplifier 31 is connected through a decoupling means 32, shown as a pin diode switch (PDS). The PDS acts as a switch which when open decouples the transmitter from a point P on the coaxial cable extending in the series portion of the connection between the transmitter and the receiver. The point P is the point of connection of the RF coil 33 to the series coaxial cable 34 which extends between the transmitter and the receiver. Coaxial cable 34 comprises series parts 35a and 35b meeting at point P. Portion 35a is short (2 or 3 cm) compared to part 35b. The point P is connected to a duplexer 36 by the portion 35b of the series coaxial cables having a length l.

The duplexer 36 comprises a pair of switching means, SW1 and SW2. The switch SW2 operates to connect the portion 35b of the coaxial cable 34 having the length l, to ground. Thus, when switch SW2 is closed the RF pulses from the transmitter are grounded and prevented from effecting the receiver of the system.

The switch SW1 in series with the line 34 simultaneously opens when switch SW2 closes to further prevent RF pulses from the transmitter from being processed as a received signal by a preamplifier 37.

The output of preamplifier 37 goes to the receiver. The receiver includes a demodulator for obtaining the lower frequency signals for operation to either provide spectroscopic data or imaging data as the case may be.

When the system is in the transmitting mode then the PDS 32 is closed switch SW1 is open and switch SW2 is closed. With the switches in this condition the transmitter is coupled to the RF coil 33 and the receiver pre-amplifier 37 is decoupled from the RF coil and hence from the transmitted pulses.

To prevent the short applied by switch SW2 from shorting the transmitted pulses, the coaxial cable 34 is provided with the length l that in one preferred embodiment is equal to $\frac{3}{4}$ of the wavelength at the resonant frequency of the higher of two operating frequencies. The $\frac{3}{4}$ being $\frac{1}{4}$ of the wavelength plus N times $\frac{1}{2}$ the wavelength at the higher Larmor frequency being transmitted, where N=1.

In the case of a 1.9 Tesla magnet where hydrogen protons are detected using transmitted pulses having frequencies of 81 MHz, the coaxial cable portion 35b is equal to $\frac{3}{4}$ of the wavelength or 186 cm at the 81 MHz. One quarter wavelength at 27 MHz, the other operating frequency is also 186 cm.

As is well known at ultra high frequencies such as are being used in the MR systems, a $\frac{1}{4}$ wavelength ($\lambda$4 line makes a short circuit look like an open circuit. Therefore, at point P the short applied by switch SW2 appears as an open and therefore does not short the transmitted signal when the transmission is either at 81 MHz or 27 MHz. Literally, when the transmission is at 81 MHz then the length l is equal to $\frac{3}{4}$ wavelength or 186 cm.

Figure 4:
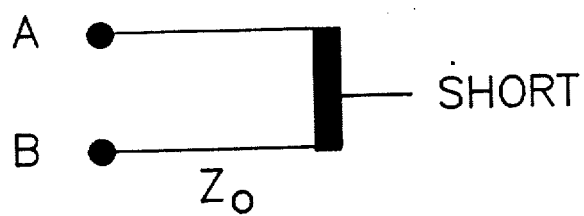
FIG. 4 is a shorted coaxial cable.
Figure 5:
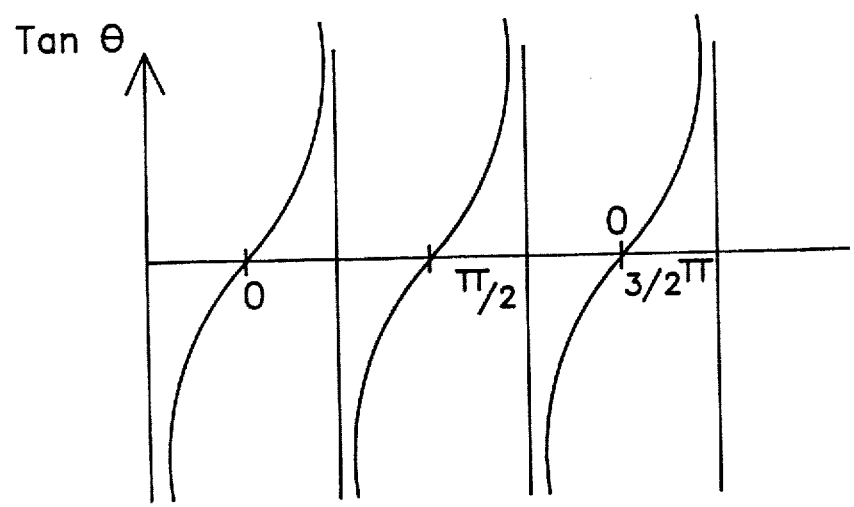
FIG. 5 is a tangent function.

The characteristic impedance Zo (FIG. 4) looking into the coaxial line follows a tangent function which repeats every 180 degree as shown in FIG. 5. A shorted $\frac{1}{4}$ wavelength coaxial cable as well as a shorted $\frac{3}{4}$ wavelength coaxial cable will appear to be infinite or an open circuit and the transmitted signal will be passed to the RF coil and cannot possibly be passed to the receiver circuitry. This is shown using FIG. 4 and FIG. 5.

More particularly, FIG. 4 shows a coaxial cable having a short thereacross. Zo is the characteristic impedence of the coaxial cable, say 50 Ohms. At the input, the measured impedance Zab is:

$$Zab = j\,Zo\,\tan(2\pi l/\lambda) = j\,Zo\,\tan[2\pi/l\,*(+N*\lambda/2]$$
$$= j\,Zo\,\tan(2\pi l/\lambda + N\pi] = \text{infinity or an open line}$$

where:

l = $\frac{1}{4}$ wavelength at 81 MHz (equivalent to 62 cm of coaxial cable)

Zab=infinity, but for fL=27±6 MHz there is a slight mismatch in the coaxial cable, however, at fH for hydrogen=81 MHz and at N=1, then $$l = fH/fL\,\lambda H/4 = 3\,\lambda H/4$$
$$= (\lambda H/4 + \lambda H/2) \text{ or } 3/4\,\lambda H$$

then at fL for phosphorous, carbon or sodium=27±6 MHz then l=$\lambda$L/4

Figure 3:
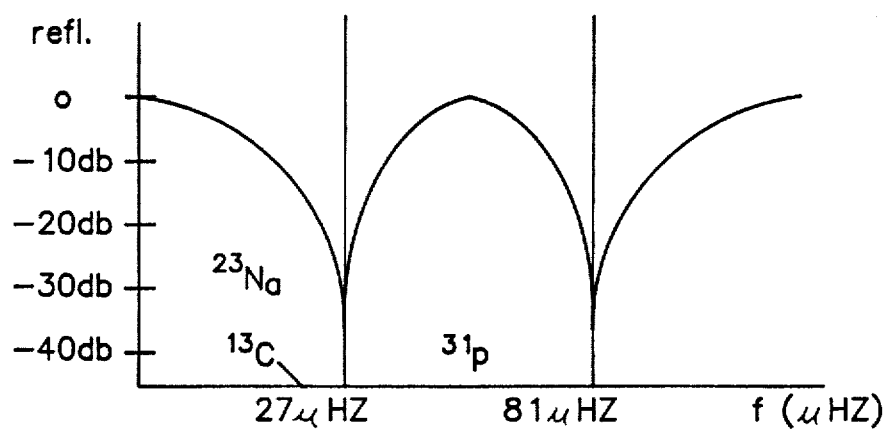
FIG. 3 is a graphic depiction of the measured reflective power of the directional coupler of FIG. 2.

Zab is therefore, infinity or an open circuit for 81 MHz and 27 MHz the reflective power at frequencies of 27±6 MHz while not down as far as it is at 81 and 27 MHz is unexpectedly sufficiently lowered to provide the desired decoupling. The effect of this is shown in FIG. 3, which graphically shows the reflectivity versus frequency. This is a showing of the reflected power of the coaxial line between the point P and the receiver responsive to received signals. This graph illustrates that at 81 MHz there is a 40 DB drop off. At the frequency of phosporous, carbon or sodium the drop off is about 20 DB.

A unique and very effective broadband matching and decoupling network is provided by properly selecting the length of the coaxial cable 35b extending between the connection point of the RF coil and the decoupling switches used in the duplexer of the receiver.

While the invention has been described using specific embodiments it should be understood that the description of these embodiments is made by way of example only and not as a limitation on the scope of the invention.

What is claimed is:

1. A broadband matching and decoupling network for connecting a radio frequency (RF) coil to a magnetic resonance (MR) data acquisition system, said MR data acquisition system having transmitter means for transmitting RF pulses and receiving means for receiving RF signals at more than one frequency, said network comprising:

a first coaxial cable connected at one end to said RF coil, a second coaxial cable connected between said transmitter means and said receiver means, means connecting the other end of said first coaxial cable to a point on said second coaxial cable, first decoupling means for decoupling the said receiver means from said second coaxial cable during transmission of said RF pulses, second decoupling means for decoupling the said transmitter means from said second coaxial cable during receipt of said RF signals, said first decoupling means including means for shorting the end of said second coaxial cable connected at the first decoupling means to ground, the length of said second coaxial cable between said point and said means for shorting is: $(f_H/f_L)\lambda_H$ where:

$f_H$=the higher frequency of said more than one frequency $f_L$=a frequency lower than said higher frequency $\lambda_H$=the wavelength at the higher frequency, and the ratio $f_H/f_L$=an odd integer, and wherein the difference between the actual lower frequency of said more than one frequency and said theoretical lower frequency is in a range that provides a reflective power output reduced by at least 20 Db relative to the forward transmitted RF power.

2. The broadband matching and decoupling network of claim 1 wherein said first decoupling means includes means for opening the circuit between said means for causing a short circuit and said pre-amplifier means.

3. The broadband matching network of claim 1 wherein said second decoupling means comprises pin diode switch means.

4. A broadband matching and decoupling network to match a radio frequency (RF) coil to an MR system at more than one frequency, said MR system having transmitter means and receiver means, said network operating to decouple said transmitter means from said receiver means at said more than one frequency, said network comprising:

a first coaxial cable coupling said RF coil to a point on a second coaxial cable extending between said transmitter means and said receiver means, amplifier means connected between the transmitter means and said second coaxial cable for amplifying RF pulses to be transmitted by said RF coil, RF pre-amplifier means connected between the second coaxial cable and said receiver means for pre-amplifying RF signals detected by said RF coil, first decoupling means connected to the receiver end of the second coaxial cable for decoupling said receiver means from said second coaxial cable during transmission of said amplified RF pulses by said RF coil, second decoupling means connected to the transmitter end of the second coaxial cable for decoupling said transmitter means from said second coaxial cable during receipt of said signals by said receiver means, said first decoupling means including means for causing a short circuit by connecting the receiver end of said second coaxial cable means to ground, and the length of said second coaxial cable between said point and said receiver end being equal to $(f_H/f_L)\lambda_H/4$ where:

$\lambda_H$ is the wavelength of the higher of said more than one frequency, $f_H$ is the frequency of the higher of said more than one frequency, $f_L$ is the frequency of the lower of said more than one frequency, $(f_H/f_L)$ is an odd integer, and wherein the resonant frequency of the lower of said more than one frequency is in the range of $f_L \pm 0.22 f_L$.

* * * * *